(12) United States Patent
Pilo

(10) Patent No.: US 10,971,218 B2
(45) Date of Patent: Apr. 6, 2021

(54) METHOD AND APPARATUS FOR MEMORY NOISE-FREE WAKE-UP PROTOCOL FROM POWER-DOWN

(71) Applicant: Synopsys, Inc., Mountain View, CA (US)

(72) Inventor: Harold Pilo, Underhill, VT (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/423,554

(22) Filed: May 28, 2019

(65) Prior Publication Data

US 2020/0381042 A1 Dec. 3, 2020

(51) Int. Cl.
*G11C 11/417* (2006.01)
*G11C 11/419* (2006.01)

(52) U.S. Cl.
CPC .......... *G11C 11/417* (2013.01); *G11C 11/419* (2013.01)

(58) Field of Classification Search
CPC .............................. G11C 11/417; G11C 11/419
See application file for complete search history.

(56) References Cited

U.S. PATENT DOCUMENTS

| 7,193,921 | B2 | 3/2007 | Choi et al. | |
|---|---|---|---|---|
| 9,564,180 | B1 | 2/2017 | Pilo et al. | |
| 2012/0013319 | A1* | 1/2012 | Patil | G11C 5/148 |
| | | | | 323/282 |
| 2016/0111142 | A1* | 4/2016 | Yang | G11C 11/417 |
| | | | | 365/154 |

OTHER PUBLICATIONS

Jonathan Chang, "A 20nm 112 Mb SRAM Design in High K/Metal Gate Technology with Assist Circuitry for Low Leakage and Low Vmin Applications", ISSCC 2013, Session 18 Advanced Embedded SRAM, See 1st paper 18.1; p. 24, shows waveforms.

* cited by examiner

*Primary Examiner* — Tri M Hoang
(74) *Attorney, Agent, or Firm* — Fenwick & West LLP

(57) ABSTRACT

A memory device having a wake-up protocol is disclosed. The memory device comprises a plurality of bitcells operative in a deep-sleep mode having corresponding bitline pairs coupled to the plurality of bitcells, a first PFET coupled between a core voltage supply and the plurality of bitcells configured to supply a core voltage to the plurality of bitcells, and a second PFET having a drain coupled to the plurality of bitcells, a source coupled to a gate of the first PFET, and a gate configured to receive a first wake signal to enable precharge of the plurality of bitcells.

16 Claims, 4 Drawing Sheets

METHOD AND APPARATUS FOR MEMORY NOISE-FREE WAKE-UP PROTOCOL FROM POWER-DOWN

FIELD OF INVENTION

The disclosure relates to a memory device and, more particularly, to a system, method, and circuit for powering the memory device from a sleep mode.

BACKGROUND

A memory device may include a deep-sleep mode or light sleep mode, which are operating modes in which the memory banks of the memory device are in a reduced power state or altogether completely shut off. The use of a sleep mode reduces the amount of electrical power consumed in comparison to an awake or normal operating mode of the memory device. Power consumption is an important consideration for many of today's electronic devices and in particular battery operated portable electronic devices.

FIG. 1 illustrates a prior art block diagram of a memory device with some memory instances in a deep-sleep mode. A memory device 10 comprises memory instances 8 and 12. The memory instances 8 are in a deep-sleep mode and the memory instances 12 are in a normal active mode (also referred to as a functional mode). When some or all of the memory instances 8 are awaken, there is a compression effect on the power supply to the memory device.

For instance, when the memory instances 8 are switched to a functional mode, the internal core voltage supplies charges these instances 8 as the instances 8 are awakened. The charging of these instances 8 from sleep mode to functional mode can cause a current surge on the power supply, which often can be very large. So large that often the current surge from the power supply can significantly droop due to the instantaneous current consumed to charge the awaken memory instances. More importantly, the power supply can droop low enough that the currently active memory instances 12 fail.

Furthermore, there is typically a switch that gates the power supply to each of the memory instances. When the switch is opened (meaning a respective instance is not being powered), the internal core voltage supply of the respective instance drains to ground due to leakage current. Eventually, the bitcells of the memory instance will lose its stored contents since the internal power will drop below a minimum voltage to keep the contents stored in the bitcells. In order to gain power savings, a retention mode or a light sleep mode is applied in which the internal core voltage supply is intentionally dropped by a smaller amount in voltage (e.g., dropped about 100 mV) to maintain the stored contents of the memory instances.

FIG. 2 illustrates a graph of a power supply that is pulled down by memory instances being woken up. The graph of the power supply has two voltage rails one potential is set at a voltage VCS (voltage core supply) and the other potential is set at ground. When the memory instances are awakened, a power surge causes the VCS and ground voltages to droop below a minimum operating voltage range $V_{min\ Fail}$. The memory device must be operated at a voltage range greater than the minimum operating voltage range to perform reliably. Due to the power source drooping below the minimum operating voltage range, the already active memory instances may undesirably fail and lose some or all of the data stored in the memory instances.

In order to combat these shortcomings, prior art has developed various methods for preventing active memory failures. In one method, the current surge from waking the memory banks is reduced by having an inverter delay chain that charges one bank first, and then a next bank after a preset amount of time has elapsed. The delay can be programmed into the inverter delay chain. In other words, the banks are turned on in a stagger manner using delay elements to provide time delays for such staggering. However, drawbacks of this method are high overhead from additional circuitry and extra logic and the staggering turn on of the memory banks is slow. Additionally, the performance of the inverter delay chain elements can undesirably change the wake-up current profile due to the process characteristics of the device.

Another prior art method provides for charging of bitlines of an asleep memory bank when waking up the memory bank. Initially, the bitlines are allowed to discharge or leak to ground as the memory bank is put to sleep. Next, the bitlines are powered up sequentially using the power supply. The power supply droop is thereby minimized by slowly charging up each of the bitlines one at a time for each of the asleep memory banks. However, in actual application this is not useful since there are a tremendous number of bitlines in each of the asleep memory banks. The amount of circuit overhead alone to individually charge each one of the bitlines is untenable; not to mention the amount of time needed to sequentially charge each bitline is very long. Moreover, bitline terminals in general are the most capacitive.

Other prior art methods attempt to reduce power supply droop by waking individual banks of memory one at a time while monitoring the core voltage supply. In addition to the disadvantage of having additional logic to control the waking of the individual banks of the memory, the initial voltage surge in charging and waking an individual bank still creates a lot of undesirable and unacceptable noise that gets permeated into the memory device.

Therefore, it is desirable to provide new methods, circuits, and systems for waking memory banks of a memory device that prevent a steep drop in the current of a power supply and reduce the noise introduced to the memory device without unduly requiring additional logic to implement.

SUMMARY OF INVENTION

A method and apparatus for operating a memory noise-free wake-up protocol from power down modes is disclosed. The memory device comprises a plurality of bitcells in a deep-sleep mode having corresponding bitline pairs coupled to the plurality of bitcells, a first PFET coupled between a voltage core supply and the plurality of bitcells configured to supply a core voltage to the plurality of bitcells, and a second PFET having a drain coupled to the plurality of bitcells, a source coupled to a gate of the first PFET, and a gate configured to receive a first wake signal to enable precharge of the plurality of bitcells.

In an aspect of the present invention, the first PFET is configured to receive a second wake signal to charge the plurality of bitcells to the core voltage. A multi-stage wake-up protocol reduces core voltage supply droop and noise that are introduced to the memory device.

In another aspect of the present invention, a predetermined delay is introduced between application of the first wake signal and the second wake signal. Minimal additional logic is used to implement the wake-up protocol.

In yet another aspect of the present invention, the memory device having a power up mode comprises a plurality of bitline cross-coupled PFETs in a deep-sleep mode having corresponding bitline pairs with each pair coupled to a respective bitline cross-coupled PFETs, a plurality of corresponding bitline precharge PFETs coupled to an input voltage supply and to the corresponding bitline pairs of the plurality of bitline cross-coupled PFETs, and a first PFET coupled between the input voltage supply and the plurality of bitline cross-coupled PFETs configured to precharge the bitline pairs to a first voltage level in response to a wake signal wherein the plurality of bitline precharge PFETs charges the bitline pairs to a second voltage level in response to a bitline restore signal. Much of the circuitry used to wake-up and charge the plurality of bitline pairs is leveraged from already available PFETs used for the memory device.

Other advantages of the disclosed wake-up protocol from power down modes will be readily apparent from the description of the drawings and detailed description.

DESCRIPTION OF THE DRAWINGS

The foregoing and other aspects of the disclosure can be better understood from the following detailed description of the embodiments when taken in conjunction with the accompanying drawings.

DETAILED DESCRIPTION OF THE EMBODIMENTS

In the following detailed description of the embodiments, reference is made to the accompanying drawings, which form a part hereof, and in which is shown by way of illustration of specific embodiments in which the present disclosure may be practiced.

Figure 1:
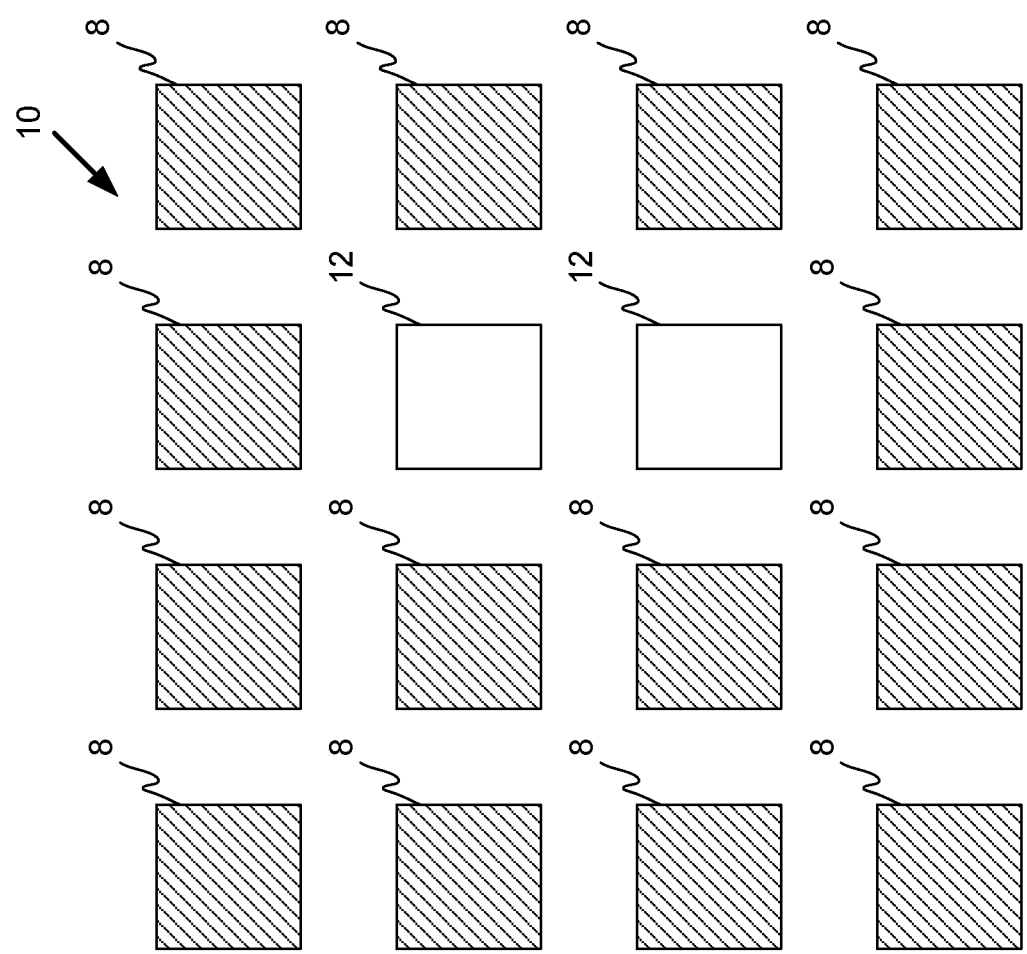
FIG. 1 illustrates a prior art block diagram of a memory device with some memory instances in a deep-sleep mode and others in an active mode.
Figure 2:
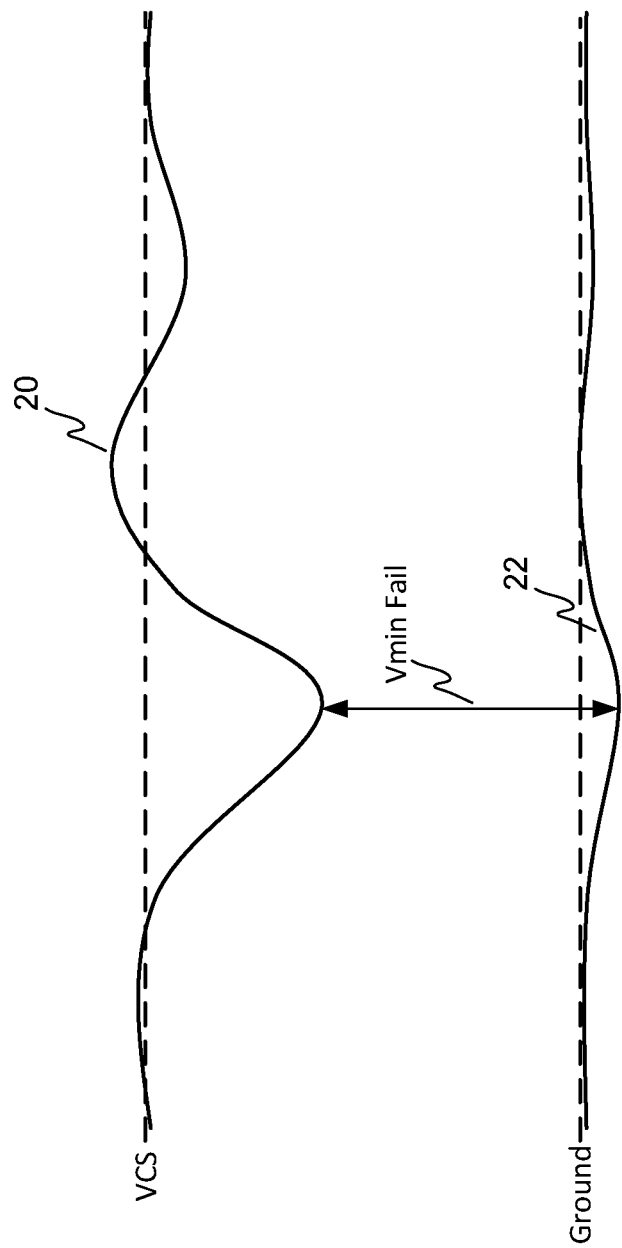
FIG. 2 illustrates a graph of a power supply that is pulled down by memory instances being woken up.
Figure 3:
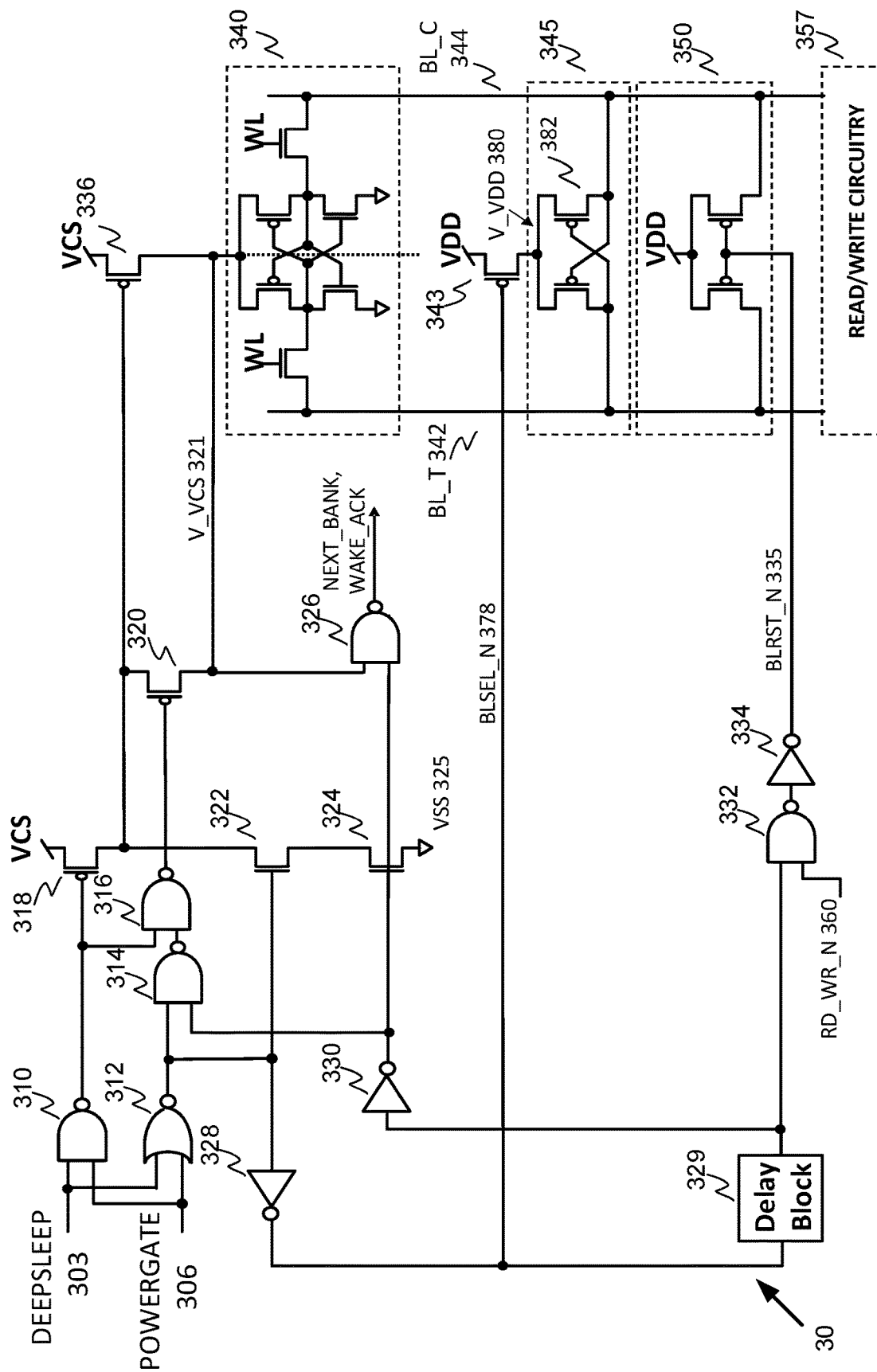
FIG. 3 illustrates a memory device having noise-free wake-up protocol from power-down modes in accordance to an embodiment of the present invention.

FIG. 3 illustrates a memory cell device 30 of the present disclosure having noise-free wake-up protocol from power-down modes. The memory cell device 30 of the present disclosure comprises a plurality of logic that controls the operation of the memory cell device 30, a bitcell 340, bitline cross-coupled PFETs 345, bitline precharge PFETs 350, and read/write circuitry 357 (not shown in detail). Detail with respect to the operation of the memory cell device 30 is not discussed so as not to obscure and deviate from the present invention since those skilled in the art readily understands the operation of a memory cell device 30. The memory cell device 30 receives inputs DEEPSLEEP 303 and POWERGATE 306 to control the various power down modes for the memory cell device 30. For example, if inputs to both POWERGATE 306 and DEEPSLEEP 303 are a logic low, then the memory cell device 30 is in normal operation mode and is fully powered and functional. If inputs to POWERGATE 306 is a high logic level and DEEPSLEEP 303 is a low logic level, then the memory cell device 30 is in retention mode and the contents or data of the bitcell 340 of the memory cell device 30 is retained. In retention mode, the bitcell supply voltage is internally reduced but above a minimum voltage for data retention. Stated differently, the supply voltage is reduced to conserve power but is not reduced so low that data will be lost in the memory cell. If inputs to POWERGATE 306 is a low logic level and DEEPSLEEP 303 is a high logic level, then the memory cell device 30 is in total retention mode where the bitcell 340 data is retained with the voltage supplied to the bitcell 340 internally reduced but above retention voltage. Moreover, in total retention mode periphery logic to the memory cell device 30 is power-gated or turned off. Finally, if inputs to both POWERGATE 306 and DEEPSLEEP 303 are a logic high, then the memory cell device 30 is in total deep-sleep mode where voltage supplied to the bitcell 340 is fully shut-off. The periphery logic to the memory cell device 30 is also power-gated similar to the total retention mode. When the memory cell device 30 is in total deep-sleep mode and the bitcell supply is fully power-gated, memory data stored in the bitcell 340 is lost.

Referring to FIG. 3, the plurality of logic for the memory cell device 30 having a bitcell 340, bitline cross-coupled PFETs 345, bitline precharge PFETs, and read/write circuitry 357 (not shown in detail) includes a nand gate 310 having a first input coupled to receive a DEEPSLEEP 303 input and a second input coupled to receive a POWERGATE 306 input. An output of nand gate 310 is coupled to a first input of nand gate 316 and to a gate of PFET 318 with a source of PFET 318 coupled to VCS (voltage core supply). A nor gate 312 has a first input coupled to receive a DEEPSLEEP 303 input and a second input coupled to receive a Powergate 306 input. An output of nor gate 312 is coupled an input of inverter 328, a first input of nand gate 314, and a gate of NFET 322. A drain of NFET 322 is coupled to a drain of PFET 318. A source of NFET 322 is coupled to a drain of NFET 324. A source of NFET 324 is coupled to VSS 325 or ground. An output of inverter 328 is coupled to an input of delay block 329. An output of delay block 329 is coupled to an input of inverter 330, and a first input of nand gate 332. An output of inverter 330 is coupled to a second input of nand gate 314, a gate input of NFET 324, and a second input of nand gate 326. An output of nand gate 314 is coupled to a second input of nand gate 316. An output of nand gate 316 is coupled to a gate of PFET 320 with a source coupled to the drain of PFET 318. A drain of PFET 320 is coupled to a first input of nand gate 326 which includes node V_VCS 321 (virtual VCS). An output of nand gate 326 provides a next bank selection or a wake acknowledgement for the memory cell device 30. The drain of PFET 320 is also coupled to a drain of PFET 336 which is coupled to node V_VCS 321. A source of PFET 336 is coupled to the VCS (voltage core supply). A gate of PFET 336 is coupled to the source of PFET 320. Bitcell 340 receives input power from node V_VCS 321 to power the bitcell 340. The bitcell 340 includes a BL_T 342 (bitline true) and BL_C 344 (bitline complement) for access the bitcell 340. BL_T 342 and BL_C 344 are also coupled to bitline cross-coupled PFETs 345, bitline precharge PFETs 350, and read/write circuitry 357. A source of PFET 343 is coupled to Vdd with the drain of PFET 343 coupled to the bitline cross-coupled PFETs 345. A gate of the PFET 343 is coupled the output of inverter 328. The output of delay block 329 is coupled to a first input of nand gate 332. A second input to nand gate 332 receives a RD_WR_N 360 signal (read write not) with an output of nand gate 332 coupled to an input of inverter 334. An output of inverter 334 is coupled to the bitline precharge PFETs 350. Read write circuitry 357 (not shown in detail) is coupled to the BL_T 342 and BL_C 344 to perform read and write access to the memory cell device 30.

In normal operation, the memory device 30 is fully powered. DEEPSLEEP 303 is a logic low and POWER-GATE 306 is a logic low. PFET 336 is on and supplying voltage core supply power to the bitcell 340. PFET 343 is turned on and Vdd power is supplied to the bitline cross-coupled PFETs 345. Bitline precharge PFETs 350 is turned on and controlled by the BLRST_N 335 (active low signal). The second input to nand gate 332 indicates a read or write operation and controls the BLRST_N 335 (bitline restore signal) coupled to the bitline precharge PFETs 350 to charge the bitlines BL_T 342 and BL_C 344.

In retention mode, POWERGATE 306 is a logic high and DEEPSLEEP 303 is a logic low. SRAM data is retained; however, bitcell power supply is internally reduced at above retention voltage to insure data in the bitcell 340 of memory cell device 30 is not lost. In order to reduce the voltage to the bitcell 340, PFET 320 is turned on which essentially shorts the source of PFET 320 with the gate of PFET 320 and since PFET 320 is coupled between the gate of PFET 336 and the drain of PFET 336, PFET 336 acts as a diode connected between the gate of PFET 336 and the drain of PFET 336 that clamps the voltage between the gate of PFET 336 and the drain of PFET 336 to a diode like voltage drop. Accordingly, PFET 336 is limited and not fully turned on to charge the bitcell 340 to a transitional voltage. Also, in retention mode, bitline BL_T 342 and bitline BL_C 344 are floated, e.g. Vdd power is removed from the bitline cross-coupled PFETs 345 and the bitline precharge PFETs 350 by turning off PFET 343 and turning off the bitline precharge PFETs 350 by a logic high from BLRST_N 335, respectively. As the bitlines BL_T 342 and BL_C 344 are floated by shutting off access to the VDD power supply, the bitlines BL_T 342 and BL_C 344 bleed or leak to ground.

In total retention mode, POWERGATE 306 is a logic low and DEEPSLEEP 303 is a logic high. Total retention mode is similar to retention mode in which the data in bitcell 340 of memory cell device 30 is retained with the exception that peripheral logic which includes decoders, and other external logic associated with the memory cell device 30 is power gated or turned off. Similar to the previous retention mode, data in bitcell 340 is retained by reducing the bitcell 340 power supply internally but above retention voltage to insure data in the bitcell 340 is not lost. To reduce the voltage supplied from the voltage core supply (VCS) to the bitcell 340, PFET 320 is turned on which essentially shorts the gate of PFET 336 with the drain of PFET 336. PFET 336 acts as a diode connected between the gate of PFET 336 and the drain of PFET 336 that clamps the voltage between the gate of PFET 336 and the drain of PFET 336 to a diode like voltage drop. Accordingly, PFET 336 is not fully turned on to charge the bitcell 340 to the normal operating voltage. Moreover, in retention mode, bitline BL_T 342 and bitline BL_C 344 are floated, e.g. Vdd power is removed from the bitline cross-coupled PFETs 345 and the bitline precharge PFETs 350 by turning off PFET 343 and turning off the bitline precharge PFETs 350, respectively. As the bitlines BL_T 342 and BL_C 344 are floated, the bitlines BL_T 342 and BL_C 344 bleed to ground.

In total deep-sleep mode, POWERGATE 306 is a logic high and DEEPSLEEP is a logic high. Voltage core supply (VCS) to Bitcell 340 is power gated or turned off. Data stored in bitcell 340 of memory device 30 is lost. Voltage supply to periphery logic is power gated or turned off. PFET 336 is floated with a logic high input to the gate of PFET 336 which turns off PFET 336. Bitline BL_T 342 and bitline BL_C 344 are also floated, e.g. VDD power is removed from the bitline cross-coupled PFETs 345 and the bitline precharge PFETs 350 by turning off PFET 343 and turning off the bitline precharge PFETs 350 by a logic high from BLRST_N 335, respectively. As the bitlines BL_T 342 and BL_C 344 are floated by removal of the VDD supply power, the bitlines BL_T 342 and BL_C 344 bleed to ground.

In general, to wake the memory cell device 30 from total deep-sleep mode, the VCS and the VDD power supply are turned on and placed on line. However, in order to avoid noise and power droop from subjecting the power supplies to a large capacitive-like load during powerup of the memory cell device 30 when waken, a wake-up protocol in accordance to an embodiment of the present invention is disclosed. The VCS power wake-up protocol is performed first. Initially, the internal bitcell node V_VCS 321 (virtual VCS) is biased to retention mode from total deep-sleep mode. Recall in retention mode, the bitcell node V_VCS 321 is internally reduced but not so low so as to not retain the data stored in the bitcell 340 of the memory cell device 30. In retention mode, DEEPSLEEP 303 is a logic low and POWERGATE 306 is a logic high. The output of nand gate 310 is a logic high applied to PFET 318 which turns off PFEF 318. A logic high is applied to a first input of nand gate 316. Nor gate 312 receives a logic low from DEEPSLEEP 303 and a logic high from POWERGATE 306 during retention mode and provides a logic low that is applied to nand gate 314. A logic low applied to an input of a nand gate produces a logic high regardless of the other input to nand gate 314. Although the other input to nand gate 314 is also a logic low after the signal flows though inverter 328, delay block 330 and inverter 330. The logic low is also applied to the other input of nand gate 314 which produces a logic high output for nand gate 314. Since two logic highs are applied to nand gate 316, a logic low results from nand gate 316 and is applied to PFET 320 which turns on PFET 320. In turning on, PFET 320 essentially shorts the gate of PFET 336 with the drain of PFET 336. Since the source of PFET 320 is coupled to the gate of PGFET 336, the voltage at the gate of PFET 336 is lowered which turns on PFET 336 to charge up bit cell node V_VCS 321 to an initial V_VCS 321 charge-up voltage level. With PFET 320 turned on, PFET 336 is configured as a diode biased PFET that limits charge to node V_VCS 321 to a lower voltage value. However, the lower voltage value of node V_VCS 321 is sufficient to preserve contents of a charged bitcell, but not so large for normal operation mode. Accordingly, node V_VCS 321 is charged to an initial charge-up voltage level.

Next, the wake-up protocol for the memory cell device 30 will transition to normal operation mode with a logic low input for DEEPSLEEP 303 and a logic low input for POWERGATE 306. Nand gate 310 receives two logic low inputs and provides a logic high output that is applied to PFET 318. The logic high applied to PFET 318 maintains PFET 318 in the off state. The logic high is also applied to a first input of nand gate 316. Nor gate 312 receives two logic low inputs and provides a logic high output that is applied to a first input of nand gate 314, inverter 328, and to the gate of NFET 322. Inverter 328 inverts the logic high and applies a logic low to the delay block 329. Inverter 330 receives the logic low after a delay from delay block 329 and outputs a logic high. The logic high from inverter 330 is applied to the second input of nand gate 314 and to the gate of NFET 324. Since the first input to nand gate 314 is also a logic high, the output of nand gate 314 is a logic low that is applied to a second input of nand gate 316. A logic low and a logic high applied to nand gate 316 produces a logic high that is applied to the gate of PFET 320. PFET 320 is turned off by the logic high applied to the gate of PFET 320 which in turn shuts off the partially turned on PFET 336. However, a logic high applied to the gate of NFET 322 and a delayed logic high from inverter 330 applied to the gate of NFET 324 turns on both NFET 322 and NFET 324. Since the gate of PFET 336 is coupled to the drain of NFET 322, the gate of PFET 336 is pulled down to VSS 325 with a delay via the delay block 329 to turn on NFET 324. With the gate of PFET 336 coupled to VSS 325, PFET 336 is turned on more fully than with PFET 320 that shorts the gate of PFET 336 with the drain of PFET 336 to create a diode like drop configuration. PFET 336 completes the wake-up protocol by fully applying the VCS power to the bitcell 340. Accordingly, a multistep wake-up protocol for the memory cell device 30 is disclosed that initially slows the charge up protocol to greatly reduce noise and voltage core supply power droop associated with charging up the memory cell device 30 from total deep-sleep mode. Nand gate 326 receives a first input from bit cell node V_VCS 321 and a second input after delay block 329 from the inverter 330 and provides an output for indication that the memory cell device 30 has awaken to normal operation mode. Moreover, in response to the output of nand gate 326, other memory banks (not shown) can be accessed and woken.

The VDD power supply is used to power the bitline BL_T 342 (true) and bitline BL_C 344 (complement) for accessing the memory cell device 30. During deep-sleep mode, the bitline BL_T 342 (true) and the bitline BL_C 344 are floated. VDD supply power to the bitline BL_T 342 and the bitline BL_C 334 is removed. Signal BLSEL_N 378 and BLRST_N 335 are at VCS or logic high. To wake the bitlines BL_T 342 and BL_C 334 from deep-sleep and in order to reduce current surge that causes noise and voltage droop, a charge up protocol for the bitline BL_T 342 and bitline BL_C 344 is performed. The output of inverter 328 is coupled node BLSEL_N 378 that is applied to PFET 343. Recall the wake-up protocol for the VCS power. During the final step of the wake-up protocol for the memory cell device 30 of the VCS power, DEEPSLEEP 303 is a logic low, and POWERGATE 306 is a logic low. With DEEPSLEEP 303 at a logic low, and POWERGATE 306 at a logic low, the output of inverter 328 that is coupled to node BLSEL_N 378 is also a logic low. The logic low applied to the gate of PFET 343, which is configured as a bitline cross-coupled power gating device, turns on PFET 343 and initiates charge up of node V_VDD 380 from VDD. As PFET 343 begins charging node V_VDD 380, bitline BL_T 342 and bitline BL_C 344 slowly charges toward VDD until one of the bitlines essentially stops precharging due to inherit imbalance between the bitline cross-coupled devices. In accordance to an embodiment of the present invention, as node V_VDD 380 charges up, bitline BL_T 342 and bitline BL_C 344 charge to VDD until bitline BL_T 342 nears a Vt (voltage threshold) below VDD for the cross-coupled PFET 382. Due to the inherit imbalance between the cross-coupled PFETs, Bitline BL_C 344 stops precharging as BL_T 342 continues to precharge until it is near VDD. After a delay as the output of inverter 328 propagates through delay block 329, the first input of nand gate 332 receives a logic low. The second input to nand gate 332, RD_WR_N 360, is a logic low to select a read and write to memory cell. The output of nand gate 332 from two logic low inputs produces a logic high that is applied to the input of inverter 334 and produces a logic low for signal bitline restore BLRST_N 335. The logic low of bitline restore BLRST_N 335 is applied to the bitline precharge PFETs 350 to complete full charge up of both bitline BL_T 342 and bitline BL_C 344. Accordingly, a multistep charge up protocol is performed to charge up the bitlines of the memory cell device 30 that greatly reduces noise and current surge on the VDD power supply when the memory cell device 30 is woken from power gating modes in which supply power has been removed. The multistep charge up protocol leverages existing components of the memory cell device 30 which greatly reduces the circuit protocol footprint compared with other wake-up protocol solutions.

Figure 4:
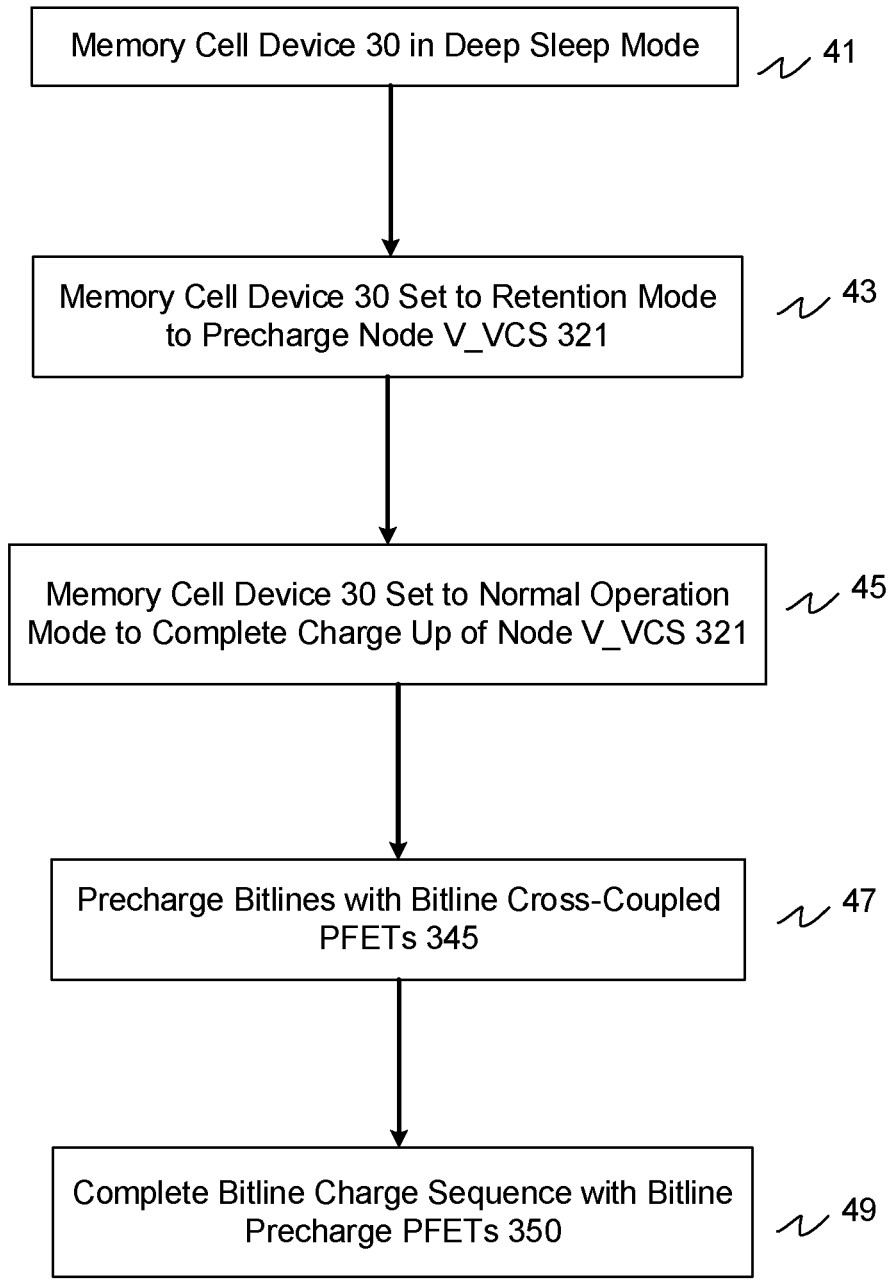
FIG. 4 is a flow diagram of a multi-step power up protocol to wake the memory cell device 30 from deep-sleep in accordance to an embodiment of the present invention.

FIG. 4 illustrates a flow diagram of a multi-step power up protocol to wake the memory cell device 30 from deep-sleep. The flow diagram begins with step 41. The memory cell device 30 is in a deep-sleep mode. PFET 336 is floated with the gate of PFET 336 at a logic high or near VCS. Bitline BL_T 342 and bitline BL_C344 are floated with BLSEL_N 378 at a logic high or near VCS and BLRST_N 335 at a logic high or near VCS. All periphery logic is power gated or turned off. Next, step 43 sets the memory cell device 30 to retention mode for precharging node V_VCS 321 to a transitional voltage level below the normal operating level. PFET 320 is turned on that essentially shorts the gate of PFET 336 with the drain of PFET 336 and clamps PFET 336 to a diode like drop. The diode like drop between the gate of PFET 336 and drain of PFET 336 prevents PFET 336 to be fully turned on. Accordingly, PFET 336 precharges node V_VCS 321 to the transitional voltage level. Next, the flow diagram moves to step 45. In step 45, the memory cell device 30 is set to normal operation mode to complete charge up of node V_VCS 321. During normal operation mode, PFET 320 is turned off, and NFET 322 and NFET 324 are turned on. With the gate of PFET 336 essentially coupled to ground or VSS 325, PFET 336 is fully turned on to complete charge up of node V_VCS 321. Step 47 is also occurring which activates VDD to precharge the bitline BL_T 342 and the bitline BL_C 344 using the bitline cross-coupled PFETs 345. BLSEL_N 378 becomes a logic low which turns on PFET 343 coupled to VDD to precharge the bitline cross-coupled PFETs 345. PFET 343 begins charging node V_VDD 380 to VDD as the bitline BL_T 342 and the bitline BL_C 344 charge until one of the bitlines essentially stops precharging due to inherit imbalance between the bitline cross-coupled PFETs 345. The other bitline continues to charge to VDD until bitline BL_T 342 reaches a Vt (threshold voltage) below VDD for the cross-coupled PFET 382. Accordingly, the bitline BL_T 342 and the bitline BL_C 344 are charged to a transitional voltage below the normal operation voltage. The flow diagram ends with step 49 that completes the bitline charge protocol using the bitline precharge PFETs 350. Signal BLRST_N 335 provides an active low that turns on the bitline precharge PFETs 350 to complete the bitline precharge protocol for the bitline BL_T 342 and the bitline BL_C 344. Accordingly, a multi-step power up protocol to wake from deep-sleep for the memory cell device 30 is disclosed that overcomes the shortcomings of current wake-up techniques from deep-sleep. Noise and power droop associated with wake-up of the memory cell device 30 are substantially reduced without undue extra logic associated with the wake-up protocol as the present invention leverages existing circuitry and logic to integrate the multi-step wake-up protocol for the memory cell device 30.

While the disclosure has been described with reference to certain embodiments, it is to be understood that the disclosure is not limited to such embodiments. Rather, the disclosure should be understood and construed in its broadest meaning, as reflected by the following claims. Thus, these claims are to be understood as incorporating not only the apparatuses, methods, and systems described herein, but all those other and further alterations and modifications as would be apparent to those of ordinary skilled in the art.

I claim:

1. A memory device having a wake-up protocol comprising:
a plurality of bitcells having corresponding bitline pairs coupled to the plurality of bitcells;
a first transistor coupled between a voltage core supply and the plurality of bitcells configured to supply a core voltage to the plurality of bitcells, the first transistor configured to receive a second wake signal to charge the plurality of bitcells to the core voltage; and
a second transistor having a drain coupled to the plurality of bitcells, a source coupled to a gate of the first transistor, and a gate configured to receive a first wake signal to enable precharge of the plurality of bitcells, wherein a delay is introduced between application of the first wake signal and the second wake signal.

2. The memory device of claim 1, further comprising:
a delay circuit for introducing the delay between the application of the first wake signal and the second wake signal.

3. The memory device of claim 1, wherein the first wake signal turns on the second transistor.

4. The memory device of claim 3, wherein the first transistor is configured as a diode coupled between the gate of the first transistor and a drain of the first transistor.

5. The memory device of claim 1, wherein the first transistor precharges the plurality of bitcells to a transitional core voltage.

6. A memory device comprising:
a plurality of bitline cross-coupled transistors operative in a deep-sleep mode having corresponding bitline pairs with each pair coupled to a respective bitline cross-coupled transistors;
a plurality of corresponding bitline precharge transistors coupled to an input voltage supply and to the corresponding bitline pairs of the plurality of bitline cross-coupled transistors;
a first transistor coupled between the input voltage supply and the plurality of bitline cross-coupled transistors configured to precharge the bitline pairs to a first voltage level in response to a wake signal wherein the plurality of bitline precharge transistors charges the bitline pairs to a second voltage level in response to a bitline restore signal; and
a delay circuit coupled between the first transistor and the plurality of corresponding bitline precharge transistors, the delay circuit for introducing a delay to the wake signal to generate the bitline restore signal.

7. The memory device of claim 6, wherein the first voltage level is a transitional voltage level of the second voltage level.

8. A method of operating a memory device, said memory device having a plurality of bitcells with corresponding bitline pairs, the method comprising:

applying a second wake signal to a first transistor coupled between a voltage core supply and the plurality of bitcells, the first transistor for supplying a core voltage to the plurality of bitcells, the second wake signal for charging the plurality of bitcells to the core voltage, and
applying a first wake signal to a gate of a second transistor having a drain coupled to the plurality of bitcells and a source coupled to a gate of the first transistor, the first wake signal for precharging the plurality of bitcells from the deep-sleep mode, wherein a delay is introduced between application of the first wake signal and the second wake signal.

9. The method of operating a memory device of claim 8, further comprising the step of introducing a predetermined time delay between applying the first wake signal and the second wake signal.

10. The method of operating a memory device of claim 8, wherein the step of turning on the second transistor includes the step of limiting the first transistor to charge the plurality of bitcells to a transitional voltage.

11. The method of operating a memory device of claim 10, wherein the step of applying the first wake signal to a gate of the second transistor to precharge the plurality of bitcells includes the step of clamping the gate and the drain of the first transistor to a diode drop to precharge the plurality of bitcells.

12. The method of operating a memory device of claim 8, wherein the step of applying the second wake signal includes the step of turning off the first wake signal.

13. The method of operating a memory device of claim 12, wherein the step of turning off the first wake signal includes the step of turning off the second transistor.

14. A method of operating a memory device, comprising:
applying a wake signal to a first transistor coupled between an input voltage supply and a plurality of bitline cross-coupled transistors, the plurality of bitline cross-coupled transistors having corresponding bitline pairs having each pairs;
applying a bitline restore signal to a plurality of corresponding bitline precharge transistors coupled to the input voltage supply, the plurality of corresponding bitline precharge transistors having corresponding bitline pairs coupled to the plurality of bitline cross-coupled transistors; and
introducing a delay to the wake signal to generate the bitline restore signal.

15. The method of operating a memory device of claim 14, wherein the step of applying the wake signal includes the step of pre-charging the first voltage level to a transitional voltage.

16. The method of operating a memory device of claim 14, wherein the step of applying the bitine restore signal includes the step of maintaining the wake signal to the first transistor.

* * * * *